United States Patent
Wada

(10) Patent No.: US 11,243,599 B2
(45) Date of Patent: Feb. 8, 2022

(54) SEMICONDUCTOR DEVICE

(71) Applicant: KIOXIA CORPORATION, Tokyo (JP)

(72) Inventor: Osamu Wada, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 59 days.

(21) Appl. No.: 16/803,908

(22) Filed: Feb. 27, 2020

(65) Prior Publication Data
US 2021/0034137 A1 Feb. 4, 2021

(30) Foreign Application Priority Data
Aug. 2, 2019 (JP) .............................. JP2019-142679

(51) Int. Cl.
  *G06F 1/3234* (2019.01)
  *G06F 1/3287* (2019.01)
  *H02J 3/46* (2006.01)
  *H03K 17/16* (2006.01)

(52) U.S. Cl.
  CPC .......... *G06F 1/3275* (2013.01); *G06F 1/3243* (2013.01); *G06F 1/3287* (2013.01); *H02J 3/46* (2013.01); *H03K 17/164* (2013.01)

(58) Field of Classification Search
  CPC ..... H03K 17/164; G06F 1/3243; G06F 1/325; G06F 1/3275; G06F 1/3287; H02J 3/46; H02J 3/48
  See application file for complete search history.

(56) References Cited

U.S. PATENT DOCUMENTS

| 5,451,888 A | * | 9/1995 | Shimada | H03K 19/01707 326/117 |
| 6,208,171 B1 | * | 3/2001 | Kumagai | H03K 19/0016 326/121 |
| 6,556,071 B2 | * | 4/2003 | Notani | H02M 3/07 327/544 |
| 7,633,314 B2 | | 12/2009 | Mair et al. | |
| 8,265,823 B2 | | 9/2012 | Kumamaru | |
| 2009/0315399 A1 | | 12/2009 | Shikata | |
| 2010/0259316 A1 | | 10/2010 | Fujita et al. | |
| 2013/0222043 A1 | | 8/2013 | Yamashita | |
| 2014/0097702 A1 | * | 4/2014 | Upputuri | G06F 1/3287 307/115 |
| 2019/0123741 A1 | * | 4/2019 | Okamoto | H03K 17/6871 |

FOREIGN PATENT DOCUMENTS

JP    2012-80380 A    4/2012

* cited by examiner

*Primary Examiner* — Patrick C Chen
(74) *Attorney, Agent, or Firm* — Kim & Stewart LLP

(57) ABSTRACT

A semiconductor device connectable between a first power-supply line connected to a power source and through which power is continuously supplied to a first circuit, and a second power-supply line that is not directly connected to the power source and is connected to a second circuit, includes a first switch connectable between the first and second power-supply lines and turned on in response to a signal for supplying power to the second circuit, a second switch connectable between the first and second power-supply lines and having a current supply capability higher than the first switch, and a control circuit configured to turn on the second switch when the first switch is turned on and a voltage applied to the second power-supply line has reached a threshold.

8 Claims, 8 Drawing Sheets

US 11,243,599 B2

SEMICONDUCTOR DEVICE

This application is based upon and claims the benefit of priority from Japanese Patent Application No. 2019-142679, filed Aug. 2, 2019, the entire contents of which are incorporated herein by reference.

FIELD

Embodiments described herein relate generally to a semiconductor device.

BACKGROUND

A power shut-down region is provided in a semiconductor integrated circuit including a memory, a logic circuit, and the like, and power switch cells (PSWs) are often disposed in a boundary between a power supply and the power shut-down region for the purpose of lowering power consumption. Power supplied from the PSWs to the power shut-down region is controlled to lower power consumption. The PSWs each have a switch element having a small channel width to prevent a rush current generated in the power shut-down region at a time of power-on and to reduce power-supply noise.

In order to suppress the rush current, the switch element having the small channel width is turned on first, which, however, delays a startup time of the semiconductor integrated circuit because of the low capability to supply power.

DETAILED DESCRIPTION

An embodiment provides a semiconductor device capable of shortening power supply startup delay time.

In general, according to one embodiment, a semiconductor device connectable between a first power-supply line connected to a power source and through which power is continuously supplied to a first circuit, and a second power-supply line that is not directly connected to the power source and is connected to a second circuit, includes a first switch connectable between the first and second power-supply lines and turned on in response to a signal for supplying power to the second circuit, a second switch connectable between the first and second power-supply lines and having a current supply capability higher than the first switch, and a control circuit configured to turn on the second switch when the first switch is turned on and a voltage applied to the second power-supply line has reached a threshold.

Embodiments will next be described with reference to the drawings. In illustration of the drawings to be described hereinafter, same or similar elements are denoted by same or similar reference signs. It is to be noted, however, that the drawings are schematic and a relationship between thicknesses and plane dimensions of constituent elements and the like differ from actual ones. Therefore, specific thicknesses and dimensions are to be determined in the light of the following description. Needless to say, the relationships of dimensions and ratios often differ among the drawings.

Moreover, embodiments described hereinafter show devices and methods for embodying the technical idea only by way of example and are not intended to limit the material, shape, structure, arrangement, and other features of each element. Various changes and modifications may be made of the embodiments within the scope of the claims.

In the following description, a first power-supply line is denoted by VDDC and a second power-supply line is denoted by VDDI, while a voltage of the first power-supply line is often denoted by VDDC and a voltage of the second power-supply line is often denoted by VDDI.

First Embodiment (Semiconductor Integrated Circuit SoC)

Figure 1:
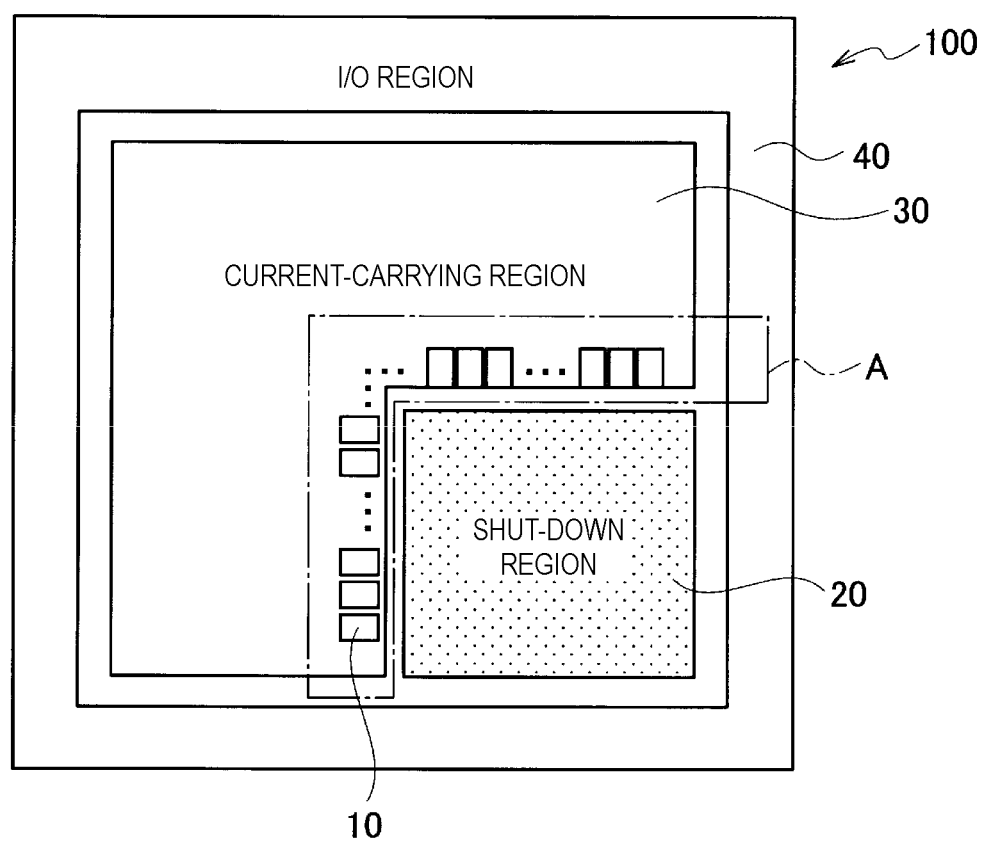
FIG. 1 is a schematic diagram of a semiconductor integrated circuit in which a semiconductor device according to a first embodiment is mounted.

FIG. 1 shows a schematic configuration of a semiconductor integrated circuit 100 in which a semiconductor device 10 according to a first embodiment is mounted. As an example of the semiconductor integrated circuit 100, a System-on-a-Chip (SoC) integrated circuit is shown. The semiconductor integrated circuit 100 includes a current-carrying region 30 as a first region and a shut-down region 20 as a second region. Power is always supplied to the current-carrying region 30 when the semiconductor integrated circuit 100 is powered on. On the other hand, power is supplied to the shut-down region 20 only as needed. A plurality of semiconductor devices 10 are disposed in a boundary region that is denoted as "region A" between the current-carrying region 30 and the shut-down region 20. Furthermore, an input/output (I/O) region 40 is disposed around the current-carrying region 30 and the shut-down region 20.

Figure 3:
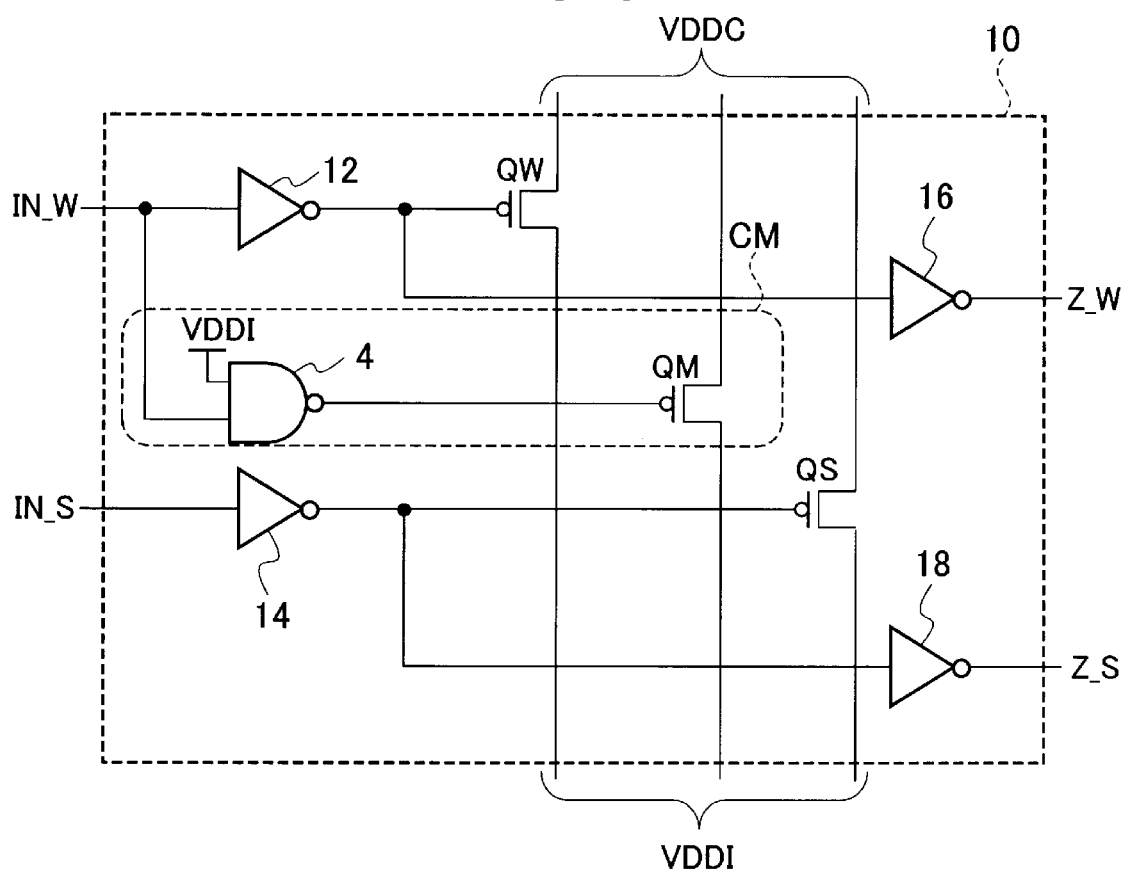
FIG. 3 is a circuit diagram of the semiconductor device according to the first embodiment.
Figure 5:
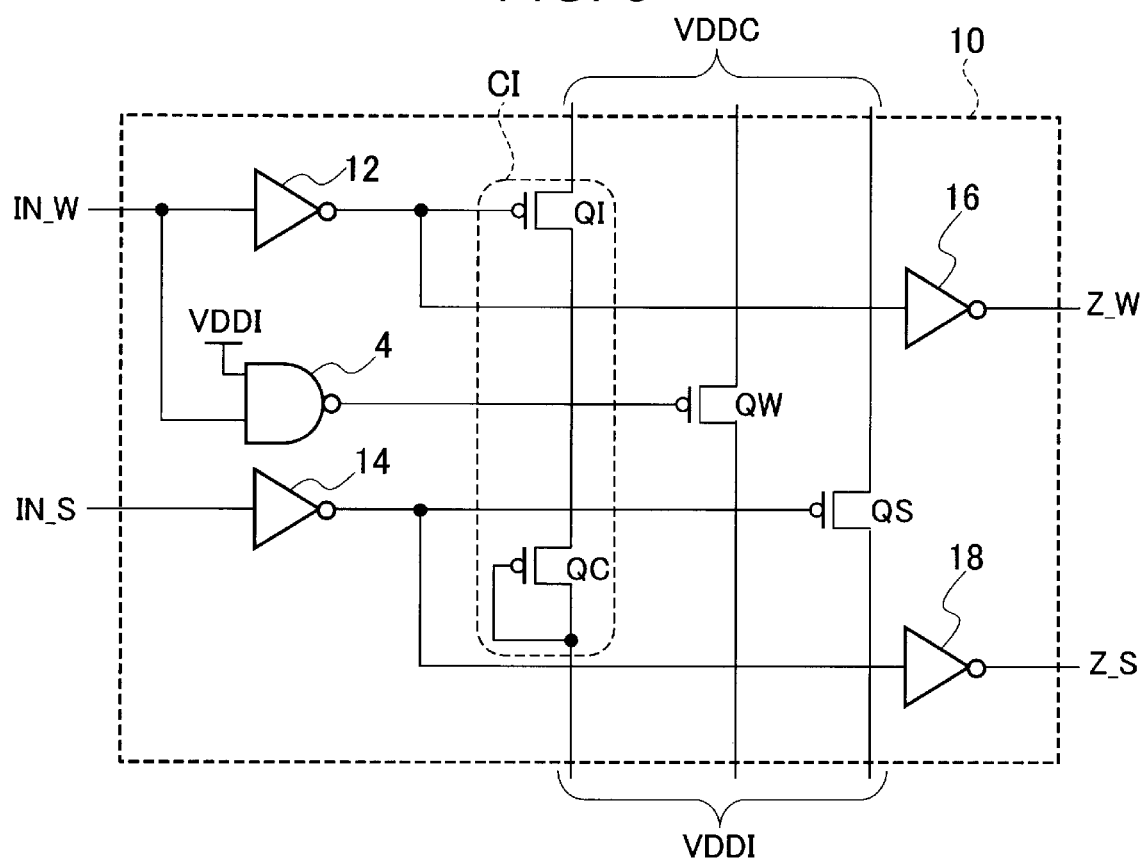
FIG. 5 is a circuit diagram of a semiconductor device according to a second embodiment.

The semiconductor device 10 according to the present embodiment operates as a PSW and has a circuit configuration of the first embodiment or that of a second embodiment as shown in FIGS. 3 and 5.

Figure 2:
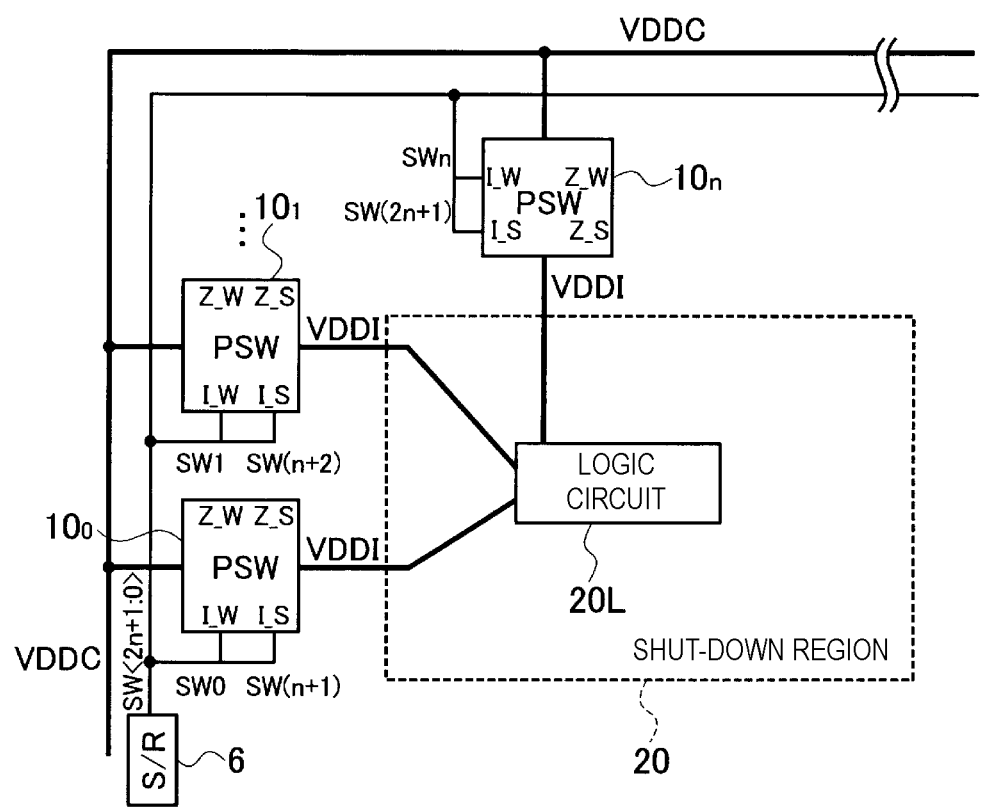
FIG. 2 is a schematic circuit diagram of parts corresponding to a region A and a shut-down region shown in FIG. 1.

FIG. 2 shows a schematic circuit diagram of parts corresponding to the region A and the shut-down region 20 of FIG. 1.

As shown in FIG. 2, the plurality of semiconductor devices $10_0$, $10_1$, ..., and $10_n$ are disposed between a first power-supply line VDDC that supplies power to the current-carrying region 30 and a second power-supply line VDDI that supplies power to the shut-down region 20. The second power-supply line VDDI is connected to, for example, a logic circuit 20L in the shut-down region 20, and a power supply voltage VDDI is supplied to the logic circuit 20L via the first power-supply line VDDC in response to switch operations of the plurality of semiconductor devices $10_0$, $10_1, \ldots,$ and $10_n$. The voltage of the second power-supply line VDDI varies in a range from zero to VDDC by the switch operations of the semiconductor devices $10_0$, $10_1$, and $10_n$.

As shown in FIG. 2, switch signals (SW0, SW(n+1)), (SW1, SW(n+2)), . . . , and (SWn, SW(2n+1)) are input, as inputs (I_W, I_S), to the semiconductor devices $10_0$, $10_1, \ldots,$ and $10_n$ by an operation of a shift register (S/R) 6.

First, switch signals SW0, SW1, . . . , and SWn are input to the semiconductor devices $10_0$, $10_1$, . . . , and $10_n$ in sequence by the operation of the shift register (S/R) 6.

Next, after the switch signal SWn is input to the semiconductor device $10_n$, switch signals SW(n+1), SW(n+2) and SW(2n+1) are input to the semiconductor devices $10_0$, $10_1$, and $10_n$ in sequence by the operation of the shift register (S/R) 6.

As shown in FIG. 3, each semiconductor device 10 according to the first embodiment includes the first power-supply line VDDC, the second power-supply line VDDI, a middle switch QM, a weak switch QW, a strong switch QS, and a control circuit 4.

The first power-supply line VDDC supplies the power to the current-carrying region 30 that is always turned on. The second power-supply line VDDI supplies the power to the shut-down region 20 where the power is turned on as needed. A voltage value of each of the first power-supply line VDDC and the second power-supply line VDDI is, for example, approximately 1 V.

The middle switch QM, the weak switch QW, and the strong switch QS are disposed between the first power-supply line VDDC and the second power-supply line VDDI.

The control circuit 4 operates on the basis of the power supplied from the first power-supply line VDDC, and monitors a voltage state of the power supplied from the second power-supply line VDDI to control the middle switch QM. In FIG. 3, a broken line CM denotes a circuit system including the middle switch QM and the control circuit 4 that controls the middle switch QM.

The weak switch QW has a current supply capability equal to or lower than a current supply capability of the middle switch QM. In addition, the strong switch QS has a current supply capability higher than the current supply capability of the middle switch QM. A current supply capability magnitude relationship among the weak switch QW, the middle switch QM, and the strong switch QS is represented as follows: the weak switch QW=<the middle switch QM<the strong switch QS. The current supply capability is determined by a size or a threshold voltage of a transistor that forms each switch. Specifically, changing a ratio of a channel width W of the transistor to a channel length L thereof makes it possible to change the current supply capability. Alternatively, changing the threshold voltage makes it possible to change the current supply capability. To change the threshold voltage, a manufacturing process condition which is, for example, channel doping is changed.

The control circuit 4 is configured to turn on the middle switch QM in response to a signal input to an input IN_W and the voltage VDDI supplied from the second power-supply line VDDI.

The control circuit 4 includes, for example, a NAND gate. The NAND gate may include, for example, a parallel circuit including two pMOSFETs and a series circuit including two nMOSFETs. The nMOSFETs for the NAND gate operates faster when having a lower threshold voltage. Thus, transistors having different threshold voltages may be used in the control circuit 4. In the present embodiment, the second power-supply line VDDI is input to one of inputs of the NAND gate 4 as the control circuit 4. The signal input from the input IN_W and driving the weak switch QW is input to the other input of the NAND gate 4. When the voltage VDDI rises and is closer to a threshold voltage of the logic circuit 20L in the shut-down region 20, the logic circuit 20L in the shut-down region 20 is turned on. The NAND gate 4 is driven at this timing.

Transistors having different threshold voltages may be used for the middle switch QM, the weak switch QW, and the strong switch QS.

Furthermore, each of the middle switch QM, the weak switch QW, and the strong switch QS may include a pMOSFET.

For example, the logic circuit 20L includes a central processing unit (CPU), an error correction code (ECC) circuit, and an encryption circuit block.

Furthermore, a memory such as a static random access memory (SRAM) may be mounted in the shut-down region 20. There is a case, for example, in which power supplied to the sole SRAM is shut down. In this case, the semiconductor devices 10 according to the present embodiment are disposed in each of the SRAM and a memory IP as PSWs for supplying the power to the SRAM, and the internal power is supplied to the SRAM only as needed, thereby reducing power consumption.

(Description of Operations)

As shown in FIG. 3, the semiconductor device 10 according to the first embodiment has inputs IN_W and IN_S and outputs Z_W and Z_S. The inputs IN_W and IN_S are connected to gates of the weak switch QW and the strong switch QS via inverter gates 12 and 14, respectively. Outputs of the inverter gates 12 and 14 are connected to inverter gates 16 and 18, and outputs of the inverter gates 16 and 18 are connected to the outputs Z_W and Z_S, respectively.

As shown in FIG. 2, each semiconductor device 10 operates as the PSW and is disposed between the first power-supply line VDDC and the second power-supply line VDDI. While the voltage VDDC of the first power-supply line VDDC is supplied to the plurality of inverter gates 12, 14, 16, and 18 and the NAND gate 4, a state of supplying the voltage VDDC is not shown in FIG. 3.

(Operating Waveform)

Figure 4:
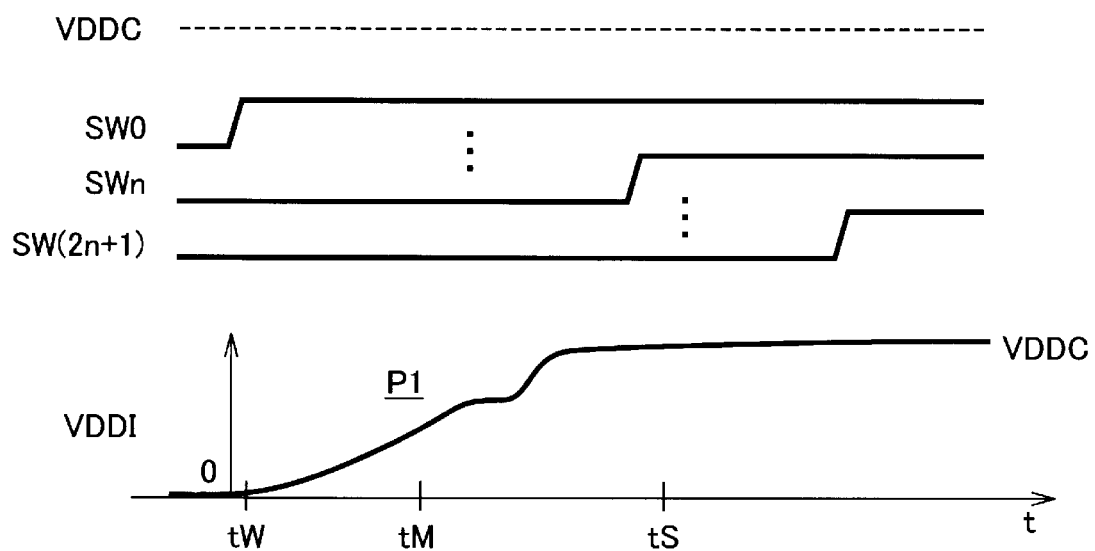
FIG. 4 is an operating waveform chart indicating a relationship among a voltage VDDI supplied to the shut-down region using the semiconductor device according to the first embodiment, a power supply voltage VDDC, and switch signals.

FIG. 4 is a diagram that indicates a relationship among the voltage VDDI supplied to the shut-down region 20 using the semiconductor devices 10 according to the first embodiment, the power supply voltage VDDC, and the switch signals. In FIG. 4, a curve P1 is an operating waveform of the semiconductor devices 10 according to the first embodiment. Furthermore, tW represents timing of turning on the weak switch QW, tM represents timing of turning on the middle switch QM, and tS represents timing of turning on the strong switch QS.

As shown in FIG. 4, first at the timing tW, the switch signal SW0 is input to the semiconductor device $10_0$, and the weak switch QW in the semiconductor device $10_0$ is turned on. Subsequently, the switch signals SW1, SWn, and SW(n+1) are input to the semiconductor devices $10_1$ to $10_n$ in sequence, and the weak switches QW in the semiconductor devices $10_1$ to $10_n$ are turned on in sequence. Next, the voltage VDDI of the second power-supply line VDDI rises, the NAND gate 4 is driven at the timing tM of turning on the logic circuit 20L within the shut-down region 20, and the middle switch QM is turned on.

In the semiconductor device 10 according to the first embodiment, the current is supplied at the timing tM of turning on the middle switch QM by an operation of the middle switch QM; thus, the current supply capability is enhanced and the voltage VDDI rises. The semiconductor device 10 according to the first embodiment can, therefore, shorten startup time before the voltage VDDI rises to be equal to the voltage VDDC. Next, at the timing tS at which the current is sufficiently supplied to the circuit, the switch signal SW(n+1) is input to the semiconductor device $10_0$, and the strong switch QS in the semiconductor device $10_0$ is turned on. Subsequently, the switch signals SW(n+1), SW(n+2), . . . , and SW(2n+1) are input to the semiconductor devices $10_1$ to $10_n$ in sequence, and the strong switches QS in the semiconductor devices $10_1$ to $10_n$ are turned on in sequence. It is thereby possible to supply the current to the shut-down region 20 so that the voltage is equal to a predetermined voltage.

By providing the circuit that monitors rising of the voltage VDDI of the second power-supply line VDDI and enhancing the current supply capability to be closer to the threshold voltage of the logic circuit 20L, the semiconductor device 10 of the first embodiment can shorten power supply startup delay time.

Since the middle switch QM has higher current supply capability than the weak switch QW, and the semiconductor device 10 can have the current supply capability that is a sum of the current supply capabilities of the weak switch QW and the middle switch QM, it is possible to speed up full charge. That is, since the current supply capability is the sum of the current supply capabilities of the weak switch QW and the middle switch QM, it is possible to enhance the current supply capability and increase a charge speed.

By providing the circuit that monitors or detects rising of the voltage VDDI of the second power-supply line VDDI and the power switch elements that operate in response to the voltage VDDI, the semiconductor device 10 according to the first embodiment can effectively shorten the power supply startup time.

Second Embodiment

As shown in FIG. 5, a semiconductor device 10 according to a second embodiment includes the first power-supply line VDDC, the second power-supply line VDDI, the weak switch QW, an initial switch QI, the strong switch QS, and the control circuit 4.

The first power-supply line VDDC supplies the power to the current-carrying region 30 that is always turned on. The second power-supply line VDDI supplies the power to the shut-down region 20 only as needed. The voltage value of each of the first power-supply line VDDC and the second power-supply line VDDI is, for example, approximately 1 V.

The weak switch QW, the initial switch QI, and the strong switch QS are disposed between the first power-supply line VDDC and the second power-supply line VDDI.

The control circuit 4 operates on the basis of the power supplied from the first power-supply line VDDC, and monitors the voltage state of the power supplied from the second power-supply line VDDI to control the weak switch QW.

Furthermore, as shown in FIG. 5, the semiconductor device 10 according to the second embodiment includes a current-limiting circuit element QC disposed between the initial switch QI and the second power-supply line VDDI. In FIG. 5, a broken line CI denotes a circuit system including the initial switch QI and the current-limiting circuit element QC.

The initial switch QI has a current supply capability equal to or higher than the current supply capability of the weak switch QW, and the strong switch QS has a current supply capability higher than the current supply capability of the initial switch QI. A current supply capability magnitude relationship among the weak switch QW, the initial switch QI, and the strong switch QS is represented as follows: the weak switch QW=<the initial switch QI<the strong switch QS. The current supply capability is determined by a size or a threshold voltage of a transistor that forms each switch.

The control circuit 4 is configured to turn on the weak switch QW in response to the signal input to the input IN_W and the voltage VDDI supplied from the second power-supply line VDDI.

Similarly to the first embodiment, the control circuit 4 may include a NAND gate. The control circuit 4 may include transistors having different threshold voltages.

Transistors having different threshold voltages may be used for the initial switch QI, the weak switch QW, and the strong switch QS.

Furthermore, each of the initial switch QI, the weak switch QW, and the strong switch QS may include a pMOS-FET.

For example, the logic circuit 20L include the CPU, the ECC circuit, and the encryption circuit block. Furthermore, the SRAM may be mounted in the shut-down region 20.

The current-limiting circuit element QC may use a transistor having different threshold voltages. The current-limiting circuit element QC may use, as the transistor having the different threshold voltages, a transistor having a low threshold voltage.

Figure 6A:
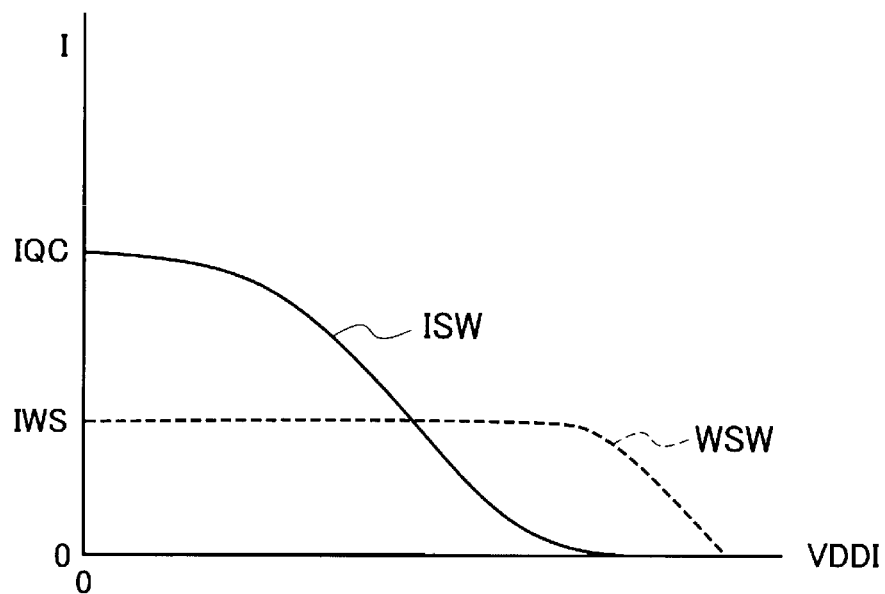
FIG. 6A shows a relationship between a conduction current I and the voltage VDDI supplied to the shut-down region in the semiconductor device according to the second embodiment.
Figure 6B:
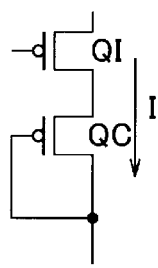
FIG. 6B is a diagram of a series circuit including an initial switch QI and a current-limiting circuit element QC.
Figure 6C:
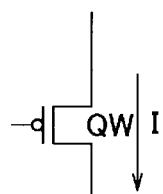
FIG. 6C is a circuit diagram of a weak switch QW.
Figure 6D:
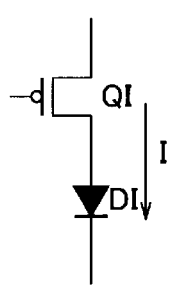
FIG. 6D is a diagram of a series circuit including the initial switch QI and a diode DI.

As shown in FIG. 6D to be described later, the current-limiting circuit element QC may include a diode DI having an anode connected to the initial switch QI and a cathode connected to the second power-supply line VDDI. The current-limiting circuit element QC may include a pMOS-FET, and may be configured such that a gate of this pMOSFET and one of main electrodes are short-circuited and connected to the second power-supply line VDDI, and the other main electrode is connected to the initial switch QI.

(Description of Operations)

As shown in FIG. 5, the semiconductor device 10 according to the second embodiment has the inputs IN_W and IN_S and the outputs Z_W and Z_S. The inputs IN_W and IN_S are connected to gates of the initial switch QI and the strong switch QS via the inverter gates 12 and 14, respectively. The outputs of the inverter gates 12 and 14 are connected to the inverter gates 16 and 18, and the outputs of the inverter gates 16 and 18 are connected to the outputs Z_W and Z_S, respectively.

As shown in FIG. 2, each semiconductor device 10 of the second embodiment operates as the PSW and is disposed between the first power-supply line VDDC and the second power-supply line VDDI. While the voltage VDDC is supplied to the plurality of inverter gates 12, 14, 16, and 18 and the NAND gate 4, the state of supplying the voltage VDDC is not shown in FIG. 5.

FIG. 6A shows a relationship between a conduction current I of each of the initial switch QI and the current-limiting circuit element QC and the voltage VDDI supplied to the shut-down region 20 in the semiconductor device 10 according to the second embodiment. Furthermore, FIGS. 6B-6D show (i) a configuration of a series circuit including the initial switch QI and the current-limiting circuit element QC, (ii) a circuit configuration of the weak switch QW, and (iii) a configuration of a series circuit including the initial switch QI and the diode DI, respectively. As shown in FIG. 6D, the current-limiting circuit element QC may include the diode DI having the anode connected to the initial switch QI and the cathode connected to the second power-supply line VDDI. In FIG. 6A, a curve ISW represents operating characteristics of the initial switch QI and the current-limiting circuit element QC in a state of turning on the initial switch QI, and a curve WSW represents operating characteristics of the weak switch QW in a state of turning on the weak switch QW. A transistor size magnitude relationship between the weak switch QW and the initial switch QI is represented as follows: the weak switch QW<the initial switch QI.

As indicated by a current level IQC of FIG. 6A, the current level IQC of a combination of the initial switch QI and the current-limiting circuit element QC is higher than a current level IWS of the weak switch QW, that is, IWS<IQC; thus, it is possible to enhance the current supply capability when the voltage VDDI supplied to the shut-down region 20 is low. It is noted, however, that a current of the diode DI in the current-limiting circuit element QC decreases in proportion to an increase in the voltage VDDI, resulting in a reduction in the conduction current I as indicated by the curve ISW. The weak switch QW is turned on to conduct the current IWS to compensate for the reduction in the conduction current I.

(Operating Waveform)

Figure 7:
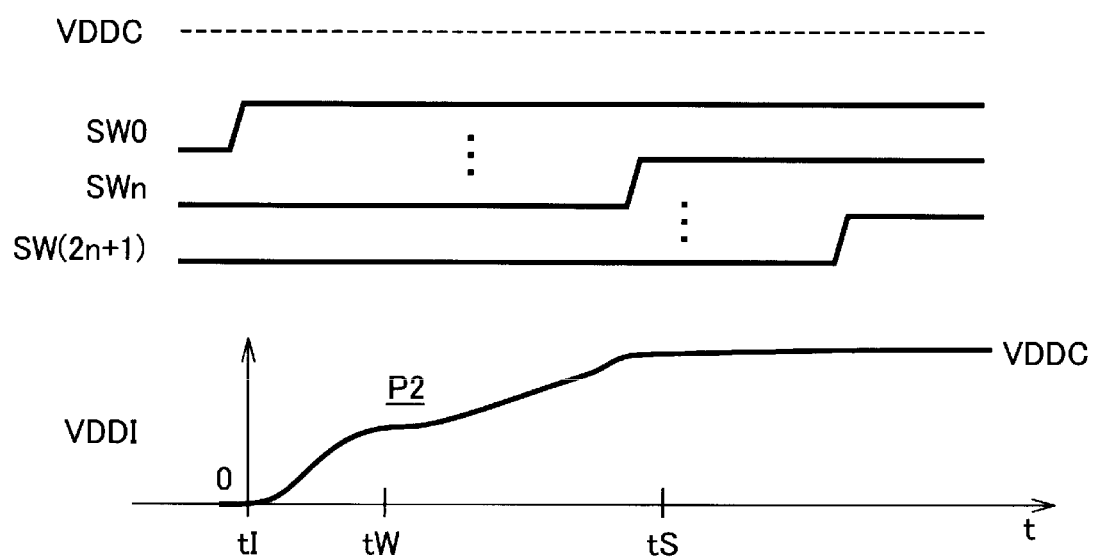
FIG. 7 is an operating waveform chart showing a relationship among the voltage VDDI supplied to the shut-down region using the semiconductor devices according to the second embodiment, the power supply voltage VDDC, and switch signals.

FIG. 7 is a diagram that indicates a relationship among the voltage VDDI supplied to the shut-down region 20 using the semiconductor devices 10 according to the second embodiment, the power supply voltage VDDC, and the switch signals. In FIG. 7, a curve P2 is an operating waveform of the semiconductor devices 10 according to the second embodiment. Furthermore, tI represents timing of turning on the initial switch QI, tW represents the timing of turning on the weak switch QW, and tS represents the timing of turning on the strong switch QS.

When the initial switch QI is turned on at tI, a current is conducted first via the initial switch QI and the current-limiting circuit element QC and the voltage VDDI rises. Subsequently, current limiting by the current-limiting element QC occurs and the initial switch QI is switched to the weak switch QW at tW, resulting in the slightly current-limited waveform P2.

When the signal is applied first to the input IN_W, the output of the inverter gate 12 becomes a low level to turn on the initial switch QI. The initial switch QI is turned on, the circuit system CI between the initial switch QI and the current-limiting circuit element QC is charged, and the voltage VDDI is closer to a level of the power supply voltage VDDC.

Since the NAND gate 4 is a monitoring or detection element, the voltage VDDI is at a low level, the input IN_W is at a high level, an output of the NAND gate 4 is at a high level, and the weak switch QW is turned off.

The current-limiting circuit element QC is a diode element. Thus, when the circuit system CI between the initial switch QI and the current-limiting circuit element QC is charged, and the voltage is equal to or higher than a threshold voltage of the diode element, the current is conducted. As a result, the current is supplied to the shut-down region 20 via the initial switch QI and the current-limiting circuit element QC. Subsequently, the weak switch QW and the strong switch QS are turned on in sequence, and the current is supplied to the shut-down region 20 so that the voltage is finally equal to a predetermined voltage.

In the semiconductor device 10 according to the second embodiment, the power switch element with the current-limiting circuit element is provided and turned on first. A speed of initial power supply is enhanced to shorten the start-up time. That is, a route of the circuit system CI including the current-limiting circuit element QC and the initial switch QI is turned on first. This makes it possible to apply the current to the shut-down region 20 in a state in which the voltage VDDI supplied to the shut-down region 20 is low. An initial motion of the initial switch QI is quickly made since the initial switch Q is turned on when the input IN_W is powered on.

In the semiconductor device 10 according to the second embodiment, a transistor size magnitude relationship among the weak switch QW, the initial switch QI, and the strong switch QS is represented as follows: the weak switch QW=<the initial switch QI<the strong switch QS. In the semiconductor device 10 according to the second embodiment, the initial switch QI is turned on first, so that startup in an initial state is faster.

While the switches are turned on in order of the weak switch QW, the middle switch QM, and the strong switch QS in the first embodiment, the switches are turned on in order of the initial switch QI, the weak switch QW, and the strong switch QS and the initial switch QI is turned on before the weak switch QW is turned on in the second embodiment. That is, the switch corresponding to the middle switch QM of the first embodiment is the weak switch QW. Three systems for applying the current are the same as those of the first embodiment. An order of the three systems for applying the current is changed from that of the first embodiment.

By providing and turning on first the power switch element with the current-limiting circuit element, the semiconductor device 10 according to the second embodiment can speed up the initial power supply and shorten the start-up time.

(Rush Current)

The second embodiment exhibits not only an advantage of shortening the startup time in the first embodiment but also an advantage of preventing a rush current. In the second embodiment, more current can flow first by an effect of the initial switch QI. On the other hand, when the voltage is closer to the threshold voltage of the internal logic circuit 21L, the current is reduced or prevented. This can prevent the rush current.

(Grouping)

Figure 8:
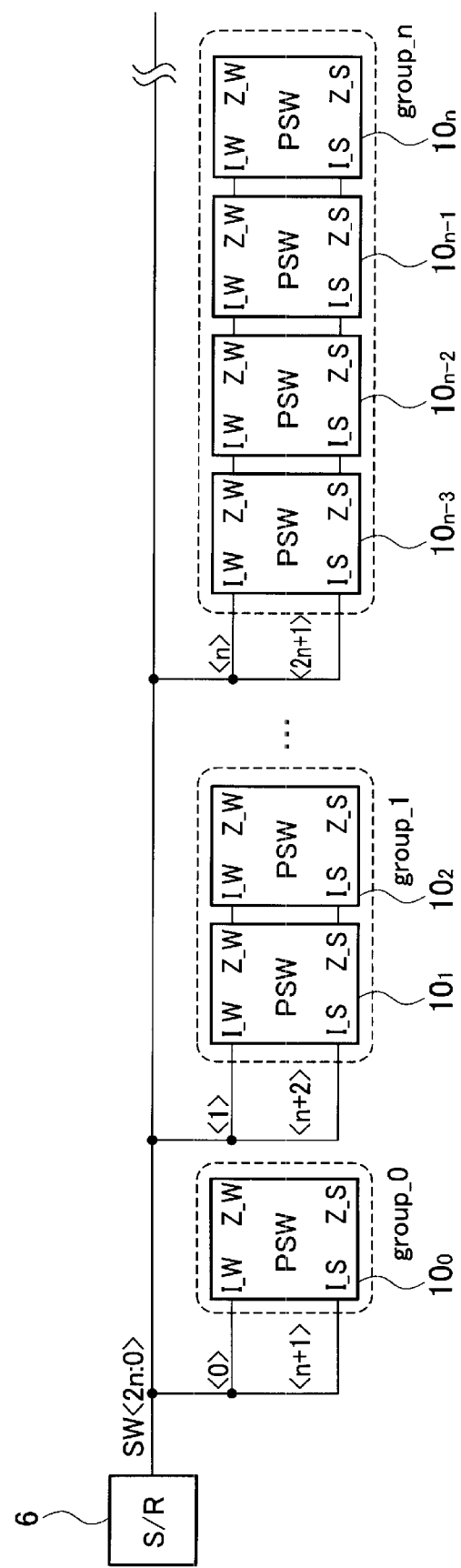
FIG. 8 is a schematic circuit diagram of a plurality of grouped semiconductor devices according to an embodiment selected by a shift register.

FIG. 8 is a schematic circuit diagram of a plurality of grouped semiconductor devices 10 according to the embodiments, which is selected by the shift register 6. As shown in FIG. 8, a plurality of groups each including any number of semiconductor devices $10_0$, $10_1$, . . . , and $10_n$ is formed according to the embodiments. In the example shown in FIG. 8, the semiconductor device $10_0$ makes up group_0, the semiconductor devices $10_1$ and $10_2$ make up group_1, and the semiconductor devices $10_{n-3}$, $10_{n-2}$, $10_{n-1}$, and $10_n$ make up group_n. The shift register 6 operates to enable the switch signals in order starting at <0>. In each group, the output Z_W or Z_S is connected to the input I_W or I_S of the next cell to turn on the PSWs in sequence. Such a grouping configuration may be selected as appropriate depending on an intended use.

As described so far, the semiconductor devices according to the embodiments can detect charge at an initial period of applying the voltage to the power to be supplied to the shut-down region or at the voltage closer to the threshold voltage of the logic circuit, and shorten the power supply startup time. Thus, it is possible to avoid performance degradation of the entire system and malfunctions of the memory, the logic circuit, and the like disposed in the shut-down region to accompany the power supply startup delay. Therefore, it is possible to provide a highly reliable and high quality semiconductor device.

While the example of using the pMOSFETs as the middle switch QM, the weak switch QW, and the strong switch QS is described in the first embodiment, the middle switch QM, the weak switch QW, and the strong switch QS may be formed by nMOSFETs. Likewise, while the example of using the pMOSFETs as the initial switch QI, the weak switch QW, and the strong switch QS is described in the second embodiment, the initial switch QI, the weak switch QW, and the strong switch QS may be formed by nMOSFETs. While the example of using the NAND gate as the control circuit is described in the first and second embodiments, not only the NAND gate but also a NOR gate or a combined circuit including a NOR gate and inverters may be used as the control circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device connectable between a first power-supply line connected to a power source and through which power is continuously supplied to a first circuit, and a second power-supply line that is not directly connected to the power source and is connected to a second circuit, the semiconductor device comprising:
    a first switch connectable between the first and second power-supply lines and turned on in response to a signal for supplying power to the second circuit;
    a current-limiting circuit connected to the first switch in series and configured to decrease current flowing therein as a voltage applied to the second power-supply line increases;
    a second switch connectable between the first and second power-supply lines and having a current supply capability equal to or lower than the first switch; and
    a control circuit configured to turn on the second switch when the first switch is turned on and the voltage applied to the second power-supply line has reached a threshold.

2. The semiconductor device according to claim 1, wherein
    the signal is input to the first switch after a first switch of another semiconductor device is turned on.

3. The semiconductor device according to claim 1, further comprising:
    a third switch connectable between the first and second power-supply lines and having a current supply capability higher than the first switch.

4. The semiconductor device according to claim 3, wherein
    the third switch is turned on after the second switch is turned on.

5. The semiconductor device according to claim 1, wherein
    the current-limiting circuit includes a diode having an anode connected to the second switch and a cathode connectable to the second power-supply line.

6. The semiconductor device according to claim 1, wherein
    the current-limiting circuit includes a p-channel MOSFET, a gate and one of main electrodes of the p-channel MOSFET are connectable to the second power-supply line, and the other main electrode is connected to the second switch.

7. The semiconductor device according to claim 1, wherein
    the control circuit includes a NAND gate to which the signal and the voltage applied to the second power-supply line are input.

8. The semiconductor device according to claim 1, wherein
    the second circuit is a logic circuit including one of a central processing unit (CPU), an error correction code circuit, an encryption circuit, and a circuit for a static random access memory (SRAM).

* * * * *